(12) United States Patent
Loeppert et al.

(10) Patent No.: US 6,535,460 B2
(45) Date of Patent: Mar. 18, 2003

(54) MINIATURE BROADBAND ACOUSTIC TRANSDUCER (75) Inventors: Peter V. Loeppert, Hoffman Estates, IL (US); Michael Pederson, Bethesda, MD (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 09/935,754

(22) Filed: Aug. 23, 2001

(65) Prior Publication Data
US 2002/0067663 A1 Jun. 6, 2002

Related U.S. Application Data (63) Continuation-in-part of application No. 09/637,401, filed on Aug. 11, 2000.

(51) Int. Cl.$^7$ ................................................ H04R 19/00
(52) U.S. Cl. ....................................................... 367/181
(58) Field of Search .................................. 367/188, 181, 367/178, 163, 174; 381/174

(56) References Cited

U.S. PATENT DOCUMENTS

| 4,628,740 A | 12/1986 | Ueda et al. |
| 4,776,019 A | 10/1988 | Miyatake |
| 4,825,335 A | 4/1989 | Wilner ........................ 361/283 |
| 4,908,805 A | 3/1990 | Sprenkels et al. ........... 367/181 |
| 4,910,840 A | 3/1990 | Sprenkels |
| 5,146,435 A | 9/1992 | Bernstein ..................... 367/181 |
| 5,151,763 A | 9/1992 | Marek et al. |
| 5,178,015 A | 1/1993 | Loeppert et al. ............... 73/718 |
| 5,357,807 A | 10/1994 | Guckel et al. |
| 5,408,731 A | 4/1995 | Berggvist et al. |
| 5,449,909 A | 9/1995 | Kaiser et al. |
| 5,452,268 A | 9/1995 | Bernstein ..................... 367/181 |
| 5,490,220 A | 2/1996 | Loeppert ..................... 381/168 |
| 5,506,919 A | 4/1996 | Roberts |
| 5,531,787 A | 7/1996 | Lesinski et al. |
| 5,740,261 A | 4/1998 | Loeppert et al. |
| 5,748,758 A | 5/1998 | Menasco, Jr. et al. |
| 5,831,262 A | 11/1998 | Greywall et al. |
| 5,870,482 A | 2/1999 | Loeppert et al. ............. 381/174 |
| 5,939,968 A | 8/1999 | Nguyen et al. |
| 6,012,335 A | 1/2000 | Bashir et al. .................. 73/724 |
| 6,078,245 A | 6/2000 | Fritz et al. |
| 6,108,184 A | 8/2000 | Minervini et al. |
| 6,191,928 B1 | 2/2001 | Rector et al. |
| 6,282,072 B1 | 8/2001 | Minervini et al. |
| 2002/0067663 A1 | 6/2002 | Loeppert et al. |

FOREIGN PATENT DOCUMENTS

| WO | WO-9605711 A1 * | 2/1996 |
| WO | WO 02/15636 | 2/2002 |

* cited by examiner

Primary Examiner—Daniel T. Pihulic
(74) Attorney, Agent, or Firm—Wallenstein & Wagner

(57) ABSTRACT

An acoustic transducer is disclosed including: a fixed perforated member; a freely movable diaphragm spaced from the perforated member; a support ring in the perforated member maintaining the proper spacing between the diaphragm and the perforated member near the perimeter; means of suspension allowing the diaphragm to rest freely on the support ring and yet mechanically decouples the diaphragm from the perforated member; means of applying an electrical field in the space between the perforated member and the diaphragm; means of detecting the change of electrical capacitance between the perforated member and the diaphragm when the diaphragm moves in response to an incident acoustic sound pressure wave.

42 Claims, 6 Drawing Sheets

MINIATURE BROADBAND ACOUSTIC TRANSDUCER

CROSS-REFERENCE TO RELATED APPLICATIONS

This application is a continuation-in-part of application Ser. No. 09/637,401, filed on Aug. 11, 2000, which is hereby incorporated herein by reference, and made a part hereof.

FEDERALLY SPONSORED RESEARCH OR DEVELOPMENT

Not applicable.

TECHNICAL FIELD

The present invention relates to miniature acoustic transducers, and in particular to a miniature acoustic transducer having a diaphragm with a planar receiving surface that remains substantially planar while deflecting pressure waves.

BACKGROUND OF THE INVENTION

The batch fabrication of acoustic transducers using similar processes as those known from the integrated circuit technology offers interesting features with regard to production cost, repeatability and size reduction. Furthermore, the technology offers the unique possibility of constructing a single transducer having a wide bandwidth of operation with a uniform high sensitivity. This provides for a transducer that, with little or no modification, can be used in such diverse applications as communications, audio, and ultrasonic ranging, imaging and motion detection systems.

The key to achieve wide bandwidth and high sensitivity lies in creating a structure having a small and extremely sensitive diaphragm. Designs have previously been suggested U.S. Pat. No. 5,146,435 to Bernstein, and in U.S. Pat. No. 5,452,268 to Bernstein. In these structures the diaphragm is suspended on a number of very flexible movable springs. However, the implementation of the springs leads to an inherent problem of controlling the acoustic leakage in the structure, which in turn affects the low frequency roll-off of the transducer. Another approach is to suspend the diaphragm in a single point, which also provides an extremely sensitive structure. See U.S. Pat. No. 5,490,220 to Loeppert. Unfortunately, in this case the properties of the diaphragm material become critical, especially the intrinsic stress gradient which causes a free film to curl. Eventually, this leads to a similar problem for this structure concerning the reproducibility of the low frequency roll-off of the transducer.

SUMMARY OF THE INVENTION

The present invention results from a realization that a diaphragm has the highest mechanical sensitivity if it is free to move in its own plane. Furthermore, if the diaphragm is resting on a support ring attached to the perforated member, a tight acoustical seal can be achieved leading to a well controlled low frequency roll-off of the transducer. Additionally, if a suspension method is chosen such that the suspension only allows the diaphragm to move in its own plane and does not take part in the deflection of the diaphragm to an incident sound pressure wave, complete decoupling from the perforated member can be achieved which reduces the sensitivity to external stresses on the transducer.

In one embodiment the present invention features an acoustic transducer consisting of a perforated member and a movable diaphragm spaced from the perforated member. The spacing is maintained by a support ring attached to the perforated member upon which the diaphragm rests. There are means for suspending the diaphragm such that the diaphragm is free to move in its own plane, thereby maximizing the mechanical sensitivity of the diagram. The suspension is achieved by restraining the diaphragm laterally between the support ring and the substrate attached to the perforated member. There are means for applying an electrical field between the perforated member and the diaphragm. There are also means for detecting the change of electrical capacitance between the perforated member and the diaphragm as the diaphragm deflects due to an incident acoustic sound pressure wave.

The thickness and size of the diaphragm are chosen such that the resonance frequency of the diaphragm is larger than the maximum acoustical operating frequency. Similarly, the dimensions of the perforated member are chosen such that the resonance frequency is larger than the maximum acoustical operating frequency. The perimeter at which the perforated member is attached to the substrate can optionally be shaped to minimize the curvature of the perforated member due to intrinsic stress in said perforated member. The suspension means of the diaphragm are made such that minimal mechanical impedance exists in the plane of the diaphragm, and yet maintains the close spacing of the diaphragm to the perforated member. The support ring is formed in the perforated member and sets the size of the active part of the diaphragm. The height of the support ring defines the initial spacing between the diaphragm and the perforated member. There are one or more openings in the diaphragm and perforated member, providing an acoustical path from the back chamber of the transducer to the surroundings thereby eliminating any barometric pressure from building up across the diaphragm. The low roll-off frequency of the transducer is limited by the corner frequency formed by the acoustical resistance of said openings and the narrow gap between the diaphragm and substrate in combination with the acoustical compliance of the transducer back chamber. The perforated member has a systematic pattern of openings providing a low acoustical resistance of the air flowing to and from the air gap between the movable diaphragm and the perforated member. The systematic pattern and size of the openings are chosen such that the high roll-off frequency of the transducer is limited by the corner frequency introduced by the acoustical resistance in combination with the acoustical compliance of the diaphragm and back chamber of the transducer. This acoustical resistance is largely responsible for the acoustic noise generated in the device. As will be appreciated by those having skill in the art, there is a tradeoff to be made between damping and noise.

The perforated member, support ring, suspension means, and diaphragm can be made from a silicon wafer using micro machining thin-film technology and photolithography and can be made of one or more materials from the group consisting of: carbon-based polymers, silicon, polycrystalline silicon, amorphous silicon, silicon dioxide, silicon nitride, silicon carbide, germanium, gallium arsenide, carbon, titanium, gold, iron, copper, chromium, tungsten, aluminum, platinum, palladium, nickel, tantalum and their alloys.

In another embodiment the present invention also features an acoustic transducer consisting of a perforated member and a movable diaphragm spaced from the perforated member. The spacing is maintained by a support ring attached to the perforated member upon which the diaphragm rests.

There are means for suspending the diaphragm such that the diaphragm is free to move in its own plane, thereby maximizing the mechanical sensitivity of the diaphragm. The suspension is achieved by utilizing high compliance springs between the diaphragm and perforated member. The spring assists in the construction and diaphragm release process, but once in operation the electrostatic attraction brings the diaphragm into contact with the perforated member support structure. Contrary to that taught by U.S. Pat. No. 5,146,435 to Bernstein, and U.S. Pat. No. 5,452,268 to Bernstein, the spring of the present invention plays an insignificant role in establishing the diaphragm compliance. There also are means for applying an electrical field between the perforated member and the diaphragm. There are further means for detecting the change of electrical capacitance between the perforated member and the diaphragm as the diaphragm deflects due to an incident acoustic sound pressure wave.

The thickness and size of the diaphragm is chosen such that the resonance frequency of the diaphragm is larger than the maximum acoustical operating frequency. Similarly, the dimensions of the perforated member are chosen such that the resonance frequency is larger than the maximum acoustical operating frequency. The perimeter at which the perforated member is attached to the substrate can optionally be shaped to minimize the curvature of the perforated member due to intrinsic stress in said perforated member. The high compliance suspension springs are made rigid enough for the structure to be made by micro machining technology, and yet compliant enough to mechanically decouple the diaphragm from the perforated member and to ensure that the in-plane resonance frequency of the diaphragm and springs is as small as possible compared to the intended low roll-off frequency of the transducer to prevent in-plane vibration of the diaphragm in operation. The support ring is formed in the perforated member and sets the size of the active part of the diaphragm. The height of the support ring defines the initial spacing between the diaphragm and the perforated member. There are one or more openings in the support ring, providing an acoustical path from the back chamber of the transducer to the surroundings thereby eliminating any barometric pressure from building up across the diaphragm. The low roll-off frequency of the transducer is limited by the corner frequency formed by the acoustical resistance of the openings and the acoustical compliance of the back chamber. The perforated member has a systematic pattern of openings providing a low acoustical resistance of the air flowing to and from the air gap between the movable diaphragm and the perforated member. The systematic pattern and size of the openings are chosen such that the high roll-off frequency of the transducer is limited by the corner frequency introduced by the acoustical resistance in combination with the acoustical compliance of the diaphragm and back chamber of the transducer. The perforated member, support ring, suspension means, and diaphragm can be made from a silicon wafer using micro machining thin-film technology and photolithography and may be made of one or more materials from the group consisting of: carbon-based polymers, silicon, polycrystalline silicon, amorphous silicon, silicon dioxide, silicon nitride, silicon carbide, germanium, gallium arsenide, carbon, titanium, gold, iron, copper, chromium, tungsten, aluminum, platinum, palladium, nickel, tantalum and their alloys.

BRIEF DESCRIPTION OF THE DRAWINGS

Other objects, features and advantages will occur to those skilled in the art from the following description and the accompanying drawings, in which.

DETAILED DESCRIPTION OF THE INVENTION

While this invention is susceptible of embodiments in may different forms, there is shown in the drawings and will herein be described in detail preferred embodiments of the invention. The present disclosure is to be considered as an exemplification of the principles of the invention and is not intended to limit the broad aspect of the invention to the embodiments illustrated.

Figure 1:
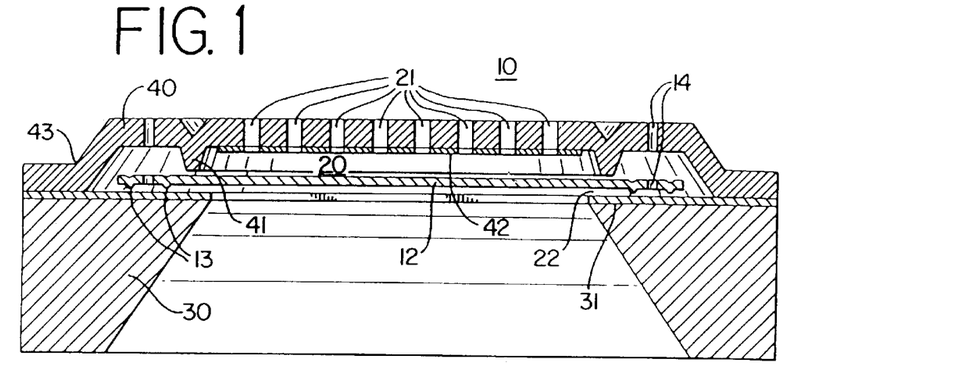
FIG. 1 is an enlarged schematic cross-sectional view taken along the line 1—1 in FIG. 2 of an acoustic transducer with clamped suspension in accordance with the present invention.
Figure 2:
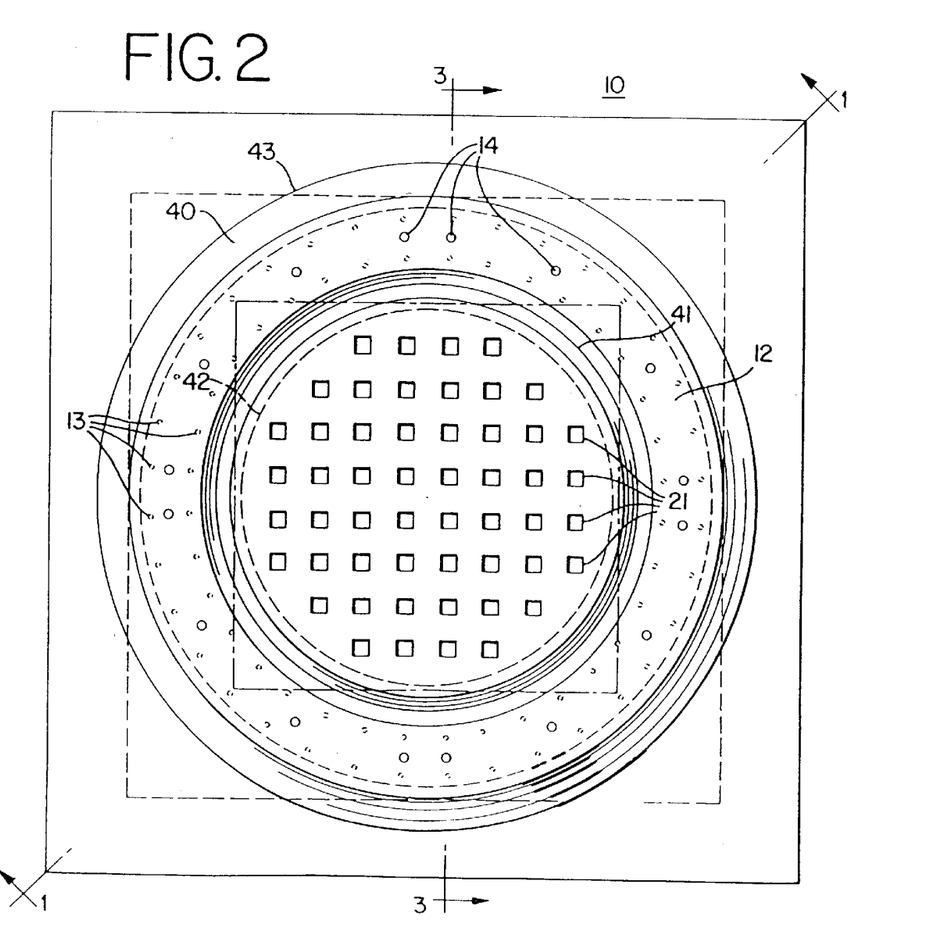
FIG. 2 is a top plan view, partially in phantom, of the acoustic transducer of FIG. 1.
Figure 3:
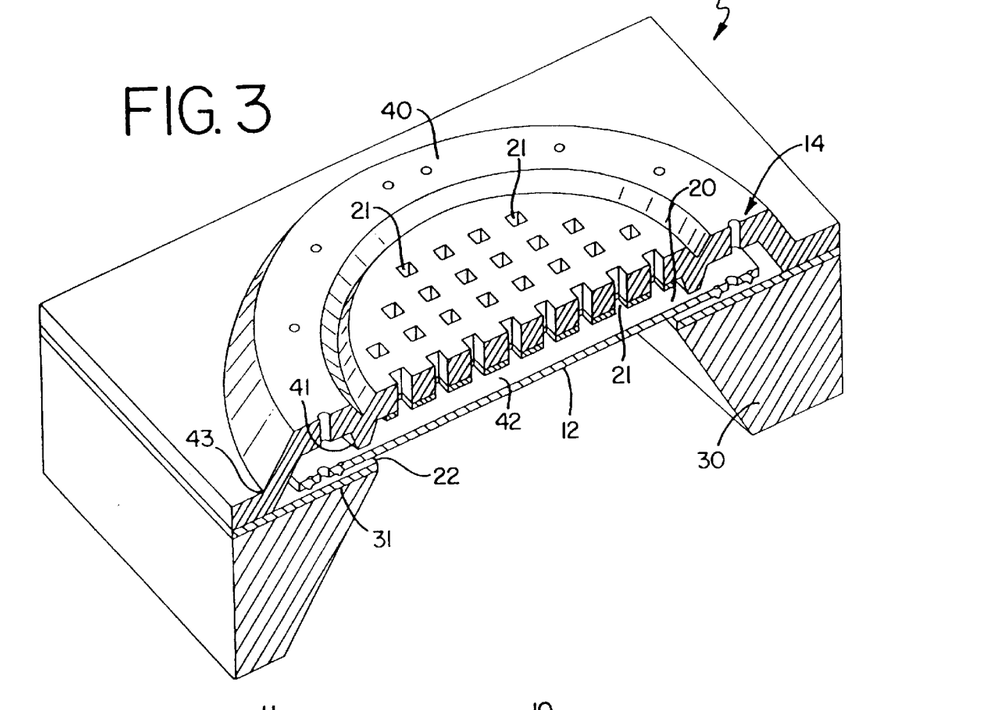
FIG. 3 is a cross-sectional perspective view of the acoustic transducer of FIG. 2 taken along line 3—3 of FIG. 2.

Referring now to the drawings, and particularly to FIGS. 1–3, an acoustic transducer in accordance with the present invention is disclosed. The acoustic transducer 10 includes a conductive diaphragm 12 and a perforated member 40 supported by a substrate 30 and separated by an air gap 20. A very narrow air gap or width 22 exists between the diaphragm 12 and substrate 30 allowing the diaphragm to move freely in its plane, thereby relieving any intrinsic stress in the diaphragm material and decoupling the diaphragm from the substrate. A number of small indentations 13 are made in the diaphragm to prevent stiction in the narrow gap between the diaphragm and substrate. The lateral motion of the diaphragm 12 is restricted by a support structure 41 in the perforated member 40, which also serves to maintain the proper initial spacing between diaphragm and perforated member. The support structure 41 may either be a continuous ring or a plurality of bumps. If the support structure 41 is a continuous ring, then diaphragm 12 resting on the support structure 41 forms tight acoustical seal, leading to a well controlled low frequency roll-off of the transducer. If the support structure 41 is a plurality of bumps, then the acoustical seal can be formed either by limiting the spacing between the bumps, by the narrow air gap 22, or a combination thereof.

Figure 4:
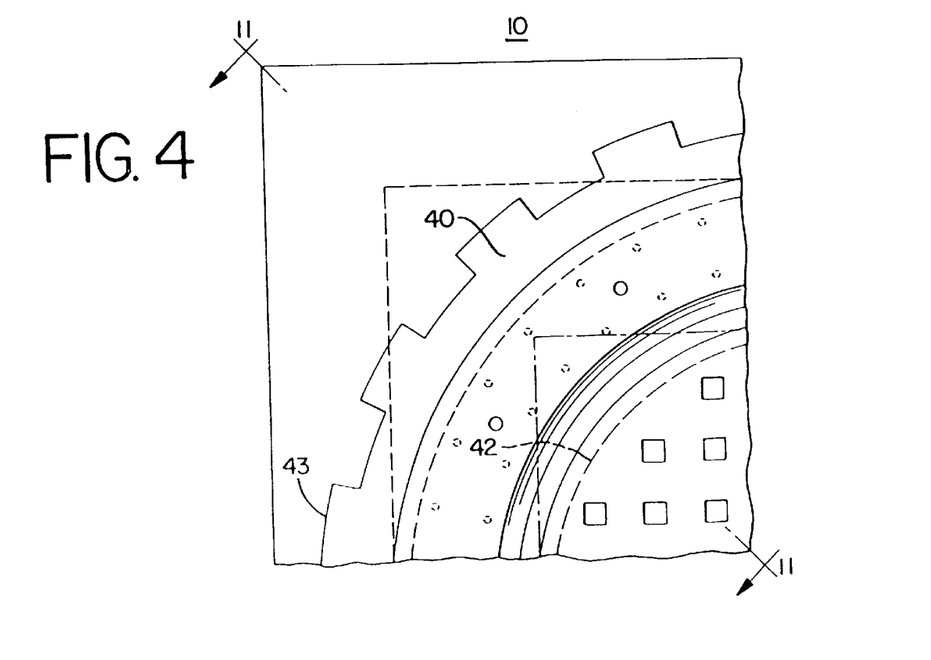
FIG. 4 is an enlarged partial top view, partially in phantom, of an acoustic transducer similar to FIG. 2 wherein the perforated member includes an optionally shaped attach perimeter.

The conducting diaphragm 12 is electrically insulated from the substrate 30 by a dielectric layer 31. A conducting electrode 42 is attached to the non-conductive perforated member 40. The perforated member contains a number of openings 21 through which a sacrificial layer (not shown) between the diaphragm and perforated member is etched during fabrication to form the air gap 20 and which later serve to reduce the acoustic damping of the air in the air gap to provide sufficient bandwidth of the transducer. A number of openings are also made in the diaphragm 12 and the perforated member 40 to form a leakage path 14 which together with the compliance of the back chamber (not shown), on which the transducer will be mounted, forms a high-pass filter resulting in a roll-off frequency low enough not to impede the acoustic function of the transducer and high enough to remove the influence of barometric pressure variations. The openings 14 are defined by photo lithographic methods and can therefore be tightly controlled, leading to a well defined low frequency behavior of the transducer. The attachment of the perforated member 40 along the perimeter 43 can be varied to reduce the curvature of the perforated member due to intrinsic internal bending moments. The perimeter can be a continuous curved surface (FIGS. 1–3) or discontinuous, such as corrugated (FIG. 4). A discontinuous perimeter 43 provides additional rigidity of the perforated member 40 thereby reducing the curvature due to intrinsic bending moments in the perforated member 40.

Figure 5:
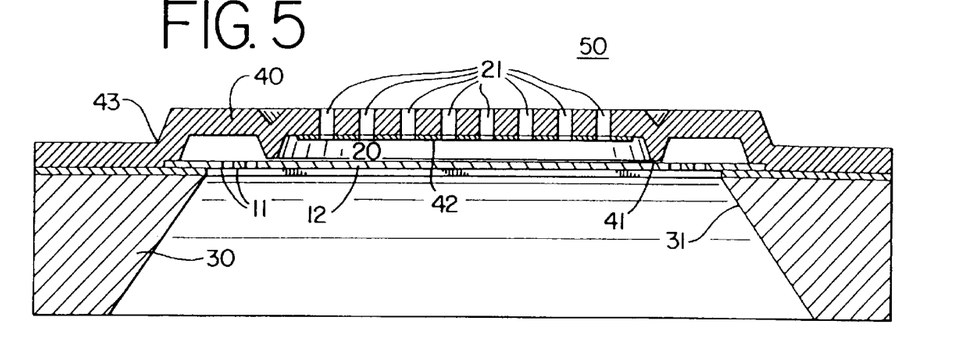
FIG. 5 is an enlarged schematic cross-sectional view taken along the plane 5—5 in FIG. 6 of an acoustic transducer with high compliance spring suspension in accordance with the present invention.
Figure 6:
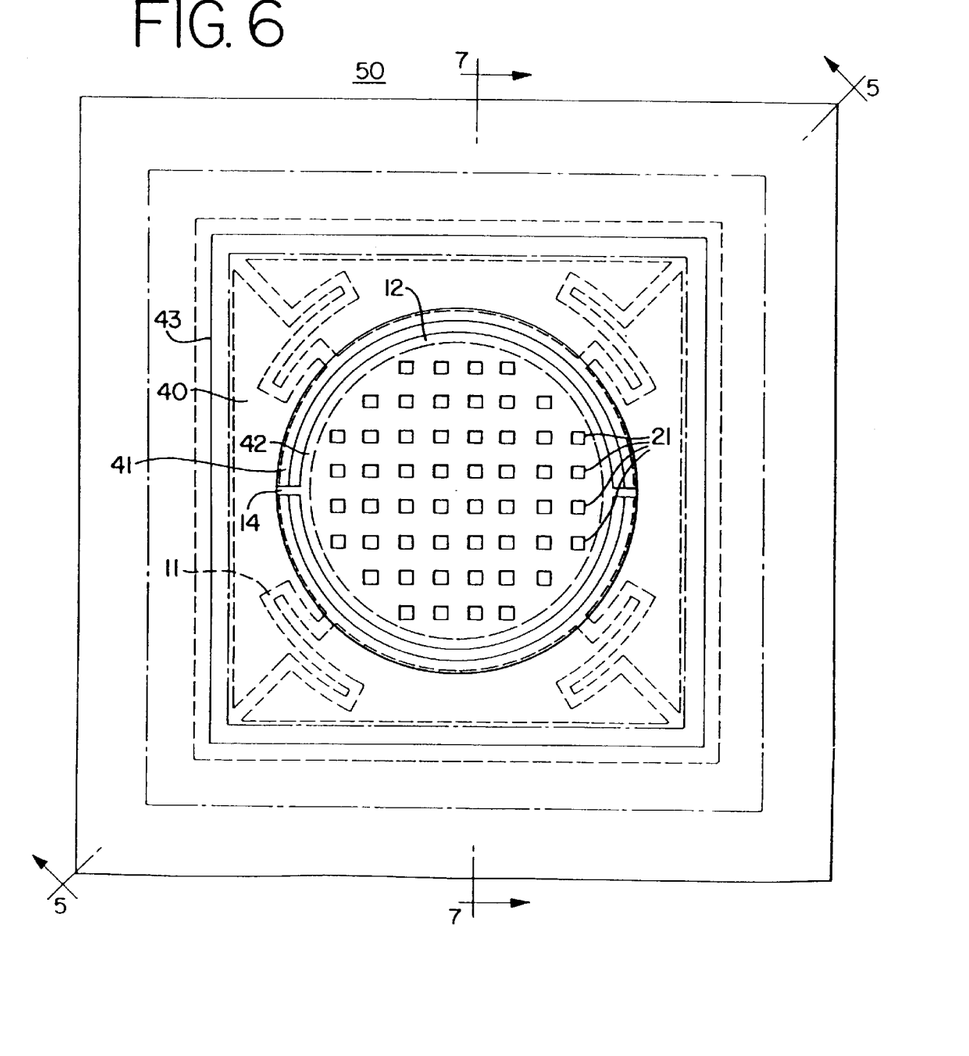
FIG. 6 is a top plan view, partially in phantom, of the acoustic transducer of FIG. 5.
Figure 7:
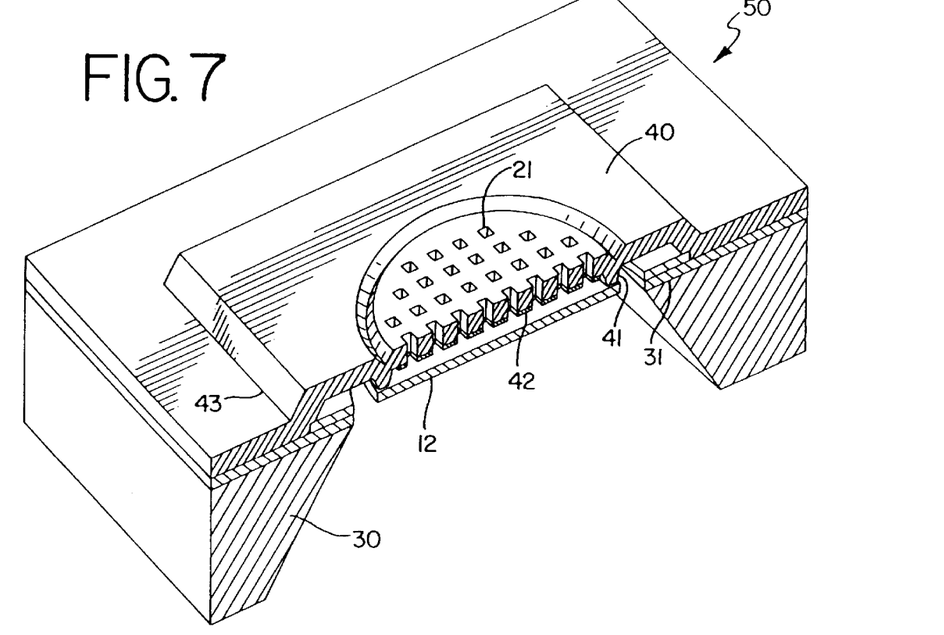
FIG. 7 is a cross-sectional perspective view of the acoustic transducer of FIG. 6 taken along plane 7—7.

Turning to FIGS. 5–7, an alternative embodiment of an acoustic transducer in accordance with the present invention is depicted. The transducer 50 includes a conductive diaphragm 12 and a perforated member 40 supported by a substrate 30 and separated by an air gap 20. The diaphragm 12 is attached to the substrate through a number of springs 11, which serve to mechanically decouple the diaphragm from the substrate, thereby relieving any intrinsic stress in the diaphragm. Moreover, the diaphragm is released for stress in the substrate and device package.

The lateral motion of the diaphragm 12 is restricted by a support structure 41 in the perforated member 40, which also serves to maintain the proper initial spacing between diaphragm and perforated member 40. The support structure 41 may either be a continuous ring or a plurality of bumps. If the support structure 41 is a continuous ring, then diaphragm 12 resting on the support structure 41 forms tight acoustical seal, leading to a well controlled low frequency roll-off of the transducer. If the support structure 41 is a plurality of bumps, then the acoustical seal can be formed by limiting the spacing between the bumps, or by providing a sufficiently long path around the diaphragm and through the perforations 21.

Figure 8:
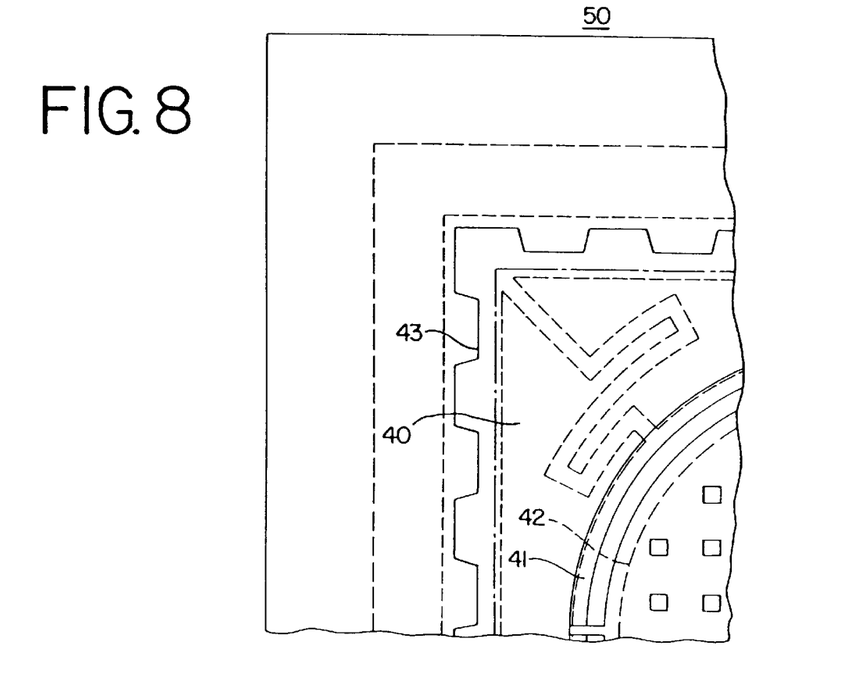
FIG. 8 is a greatly enlarged partial top view, partially in phantom, of an acoustic transducer similar to FIG. 5 wherein the perforated member includes an optionally shaped attach perimeter.
Figure 11:
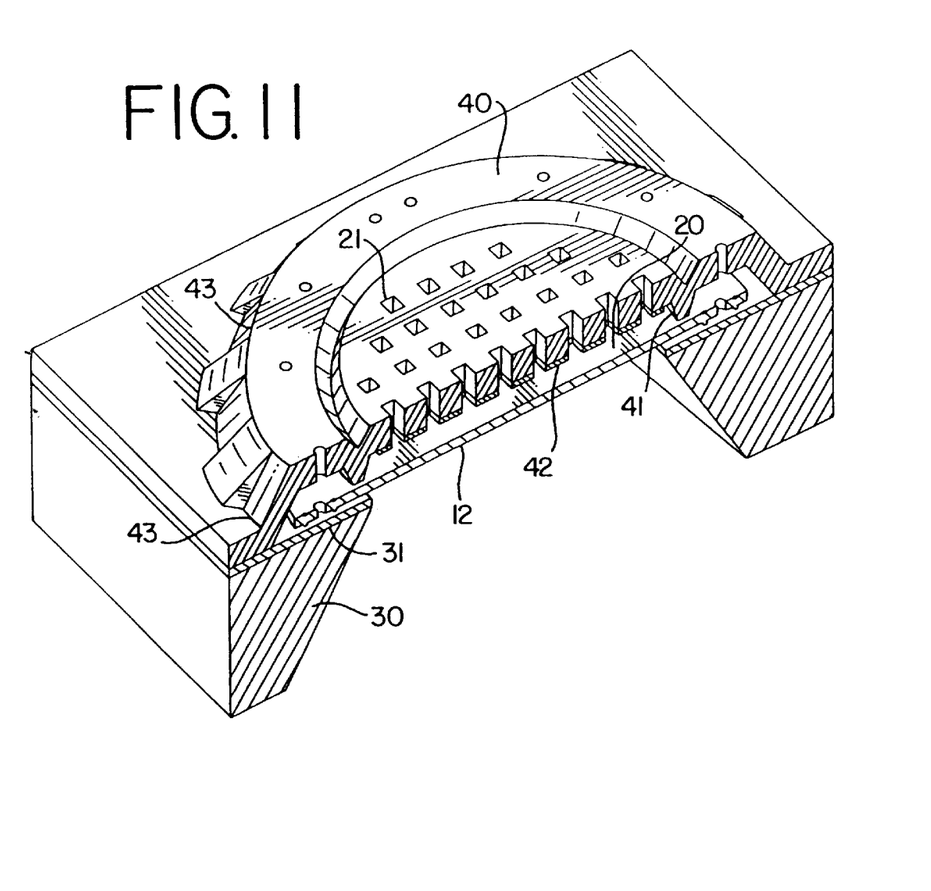
FIG. 11 is a cross-sectional perspective view of the acoustic transducer of FIG. 4 taken along line 11—11.

The conducting diaphragm 12 is electrically insulated from the substrate 30 by a dielectric layer 31. A conducting electrode 42 is attached to the non-conductive perforated member 40. The perforated member contains a number of openings 21 through which a sacrificial layer (not shown) between the diaphragm 12 and the perforated member is etched during fabrication to form the air gap 20 and which later serves to reduce the acoustic damping of the air in the air gap to provide sufficient bandwidth of the transducer. A number of openings are made in the support structure 41 to form a leakage path 14 (FIG. 6) which together with the compliance of the back chamber (not shown) on which the transducer can be mounted forms a high-pass filter resulting in a roll-off frequency low enough not to impede the acoustic function of the transducer and high enough to remove the influence of barometric pressure variations. The openings 14 are preferably defined by photo lithographic methods and can therefore be tightly controlled, leading to a well defined low frequency behavior of the transducer. The attachment of the perforated member along the perimeter 43 can be varied to reduce the curvature of the perforated member due to intrinsic internal bending moments. The perimeter 43 can be smooth (FIGS. 5–7) or corrugated (FIGS. 8 and 11). A corrugated perimeter provides additional rigidity of the perforated member thereby reducing the curvature due to intrinsic bending moments in the perforated member.

In operation, an electrical potential is applied between the conductive diaphragm 12 and the electrode 42 on the perforated member. The electrical potential and associated charging of the conductors produces an electrostatic attraction force between the diaphragm and the perforated member. As a result, the free diaphragm 12 moves toward the perforated member 40 until it rests upon the support structure 41, which sets the initial operating point of the transducer with a well defined air gap 20 and acoustic leakage through path 14. When subjected to acoustical energy, a pressure difference appears across the diaphragm 12 causing it to deflect towards or away from the perforated member 40. The deflection of the diaphragm 12 causes a change of the electrical field, and consequently capacitance, between the diaphragm 12 and the perforated member 40. As a result the electrical capacitance of the transducer is modulated by the acoustical energy.

Figure 9:
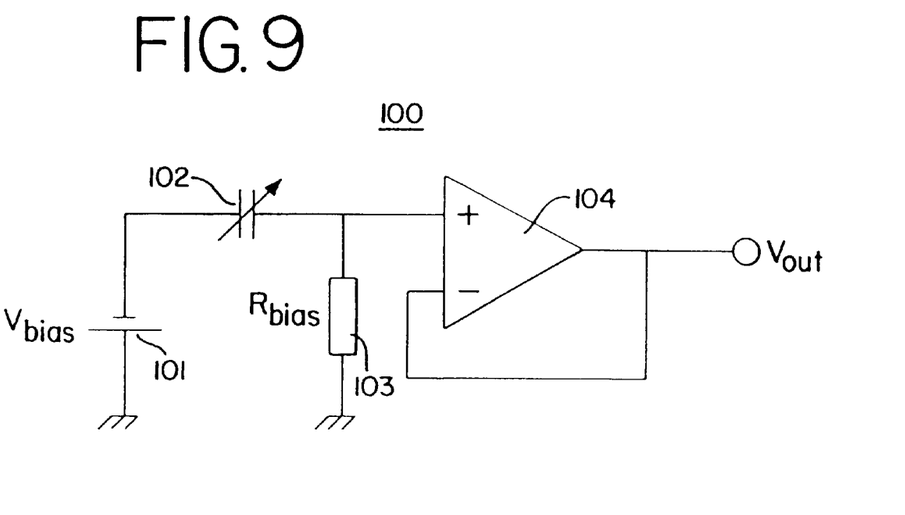
FIG. 9 is an electrical circuit for the detection of the change of the microphone capacitance while maintaining a constant electrical charge on the microphone.

A method to detect the modulation of capacitance is shown in FIG. 9. In the detection circuit 100, the transducer 102 is connected to a DC voltage source 101 and a unity-gain amplifier 104 with very high input impedance. A bias resistor 103 ties the DC potential of the amplifier input to ground whereby the DC potential "Vbias" is applied across the transducer. Assuming in this circuit a constant electrical charge on the transducer, a change of transducer capacitance results in a change of electrical potential across the transducer, which is measured by the unity-gain amplifier.

Figure 10:
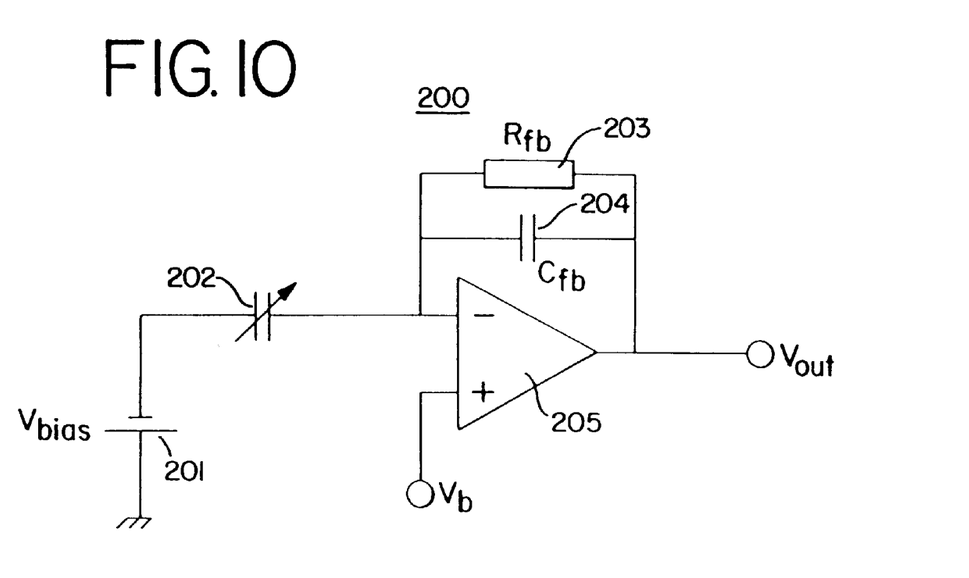
FIG. 10 is an electrical circuit for the detection of the change of the microphone capacitance while maintaining a constant electrical potential on the microphone.

Another method to detect the modulation of capacitance is shown in FIG. 10. In the detection circuit 200, the transducer 202 is connected to a DC voltage source 201 and a charge amplifier configuration 205 with a feedback resistor 203 and capacitor 204. The feedback resistor ensures DC stability of the circuit and maintains the DC level of the input of the amplifier, whereby the DC potential "Vbias–Vb" is applied across the transducer. Assuming in this circuit a constant potential across the transducer, due to the virtual ground principle of the amplifier, a change of capacitance causes a change of charge on the transducer and consequently on the input side of the feedback capacitor leading to an offset between the negative and positive input on the amplifier. The amplifier supplies a mirror charge on output side of the feedback capacitor to remove the offset, resulting in a change of output voltage "Vout." The charge gain in this circuit is set by the ratio between the initial transducer capacitance and the capacitance of the feedback capacitor. An advantage of this detection circuit is that the virtual ground principle of the amplifier eliminates any parasitic capacitance to electrical ground in the transducer, which otherwise attenuate the effect of the dynamic change of microphone capacitance. However, care should be taken to reduce parasitic capacitances to minimize the of gain of any noise on the signal "Vb" and the inherent amplifier noise.

While the specific embodiment has been illustrated and described, numerous modifications come to mind without significantly departing from the spirit of the invention, and the scope of protection is only limited by the scope of the accompanying Claims.

We claim:

1. An acoustic transducer comprising:
   a cover member having a planar surface with a plurality of perforations therein;
   a substrate operably attached to said perforated member;
   a diaphragm positioned between said cover member and said substrate, said diaphragm laterally movable within a plane parallel to said planar surface of said cover member;
   a circuit operably coupled to said diaphragm to apply an electrical field in the space between said perforated member and diaphragm;
   a circuit operably coupled to said diaphragm and responsive to changes in electrical capacitance between said cover member and said diaphragm; and
   wherein the cover member includes a perimeter of attachment between said cover member and said substrate that is shaped to reduce the sensitivity of said cover member to intrinsic internal bending moments.

2. The acoustic transducer of claim 1 wherein said perimeter is corrugated.

3. The acoustic transducer of claim 1 wherein said cover member and said substrate define a lateral restraint.

4. The acoustic transducer of claim 1 wherein one or more indentations are made in said diaphragm to prevent stiction between said diaphragm and said substrate.

5. The acoustic transducer of claim 1 wherein said cover member includes a support structure having one or more openings to reduce sensitivity of said cover member to intrinsic internal bending moments.

6. The acoustic transducer of claim 1 wherein one or more mechanical springs are operably connected to said cover member and said diaphragm.

7. The acoustic transducer of claim 1 wherein one or more coincident openings are made in said diaphragm and said cover member to provide a low frequency pressure equalization path across said diaphragm.

8. The acoustic transducer of claim 1 wherein one or more non-coincident openings are made in said diaphragm and said cover member.

9. The acoustic transducer of claim 1 wherein said cover member includes a support structure having one or more openings made therein to provide a low frequency pressure equalization path across said diaphragm.

10. The acoustic transducer of claim 1 wherein said cover member includes a support structure and said diaphragm is held in position against said support structure by electrostatic attraction forces generated between said diaphragm and said perforated member due to said electrical field.

11. The acoustic transducer of claim 1 wherein said diaphragm and cover member are made on a silicon wafer using photo lithographic techniques.

12. The acoustic transducer of claim 1 wherein said diaphragm and cover member are made from one or more materials consisting of carbon-based polymers, silicon, polycrystalline silicon, amorphous silicon, silicon dioxide, silicon nitride, silicon carbide, germanium, gallium arsenide, carbon, titanium, gold, iron, copper, chromium, tungsten, aluminum, platinum, palladium, nickel, tantalum and their alloys.

13. An acoustic transducer comprising:
   a cover member having a planar surface with a plurality of perforations therein;
   a substrate operably attached to said perforated member;
   a diaphragm positioned between said cover member and said substrate, said diaphragm laterally movable within a plane parallel to said planar surface of said cover member;
   a circuit operably coupled to said diaphragm to apply an electrical field in the space between said perforated member and diaphragm;
   a circuit operably coupled to said diaphragm and responsive to changes in electrical capacitance between said cover member and said diaphragm; and
   wherein said cover member includes a support structure having one or more openings made therein to provide a low frequency pressure equalization path across said diaphragm.

14. The acoustic transducer of claim 13 wherein the cover member includes a perimeter of attachment between said cover member and said substrate that is shaped to reduce the sensitivity of said cover member to intrinsic internal bending moments.

15. The acoustic transducer of claim 13 wherein said cover member and said substrate define a lateral restraint.

16. The acoustic transducer of claim 13 wherein one or more indentations are made in said diaphragm to prevent stiction between said diaphragm and said substrate.

17. The acoustic transducer of claim 13 wherein said cover member includes a support structure having one or more openings to reduce sensitivity of said cover member to intrinsic internal bending moments.

18. The acoustic transducer of claim 13 wherein one or more mechanical springs are operably connected to said cover member and said diaphragm.

19. The acoustic transducer of claim 13 wherein one or more coincident openings are made in said diaphragm and said cover member to provide a low frequency pressure equalization path across said diaphragm.

20. The acoustic transducer of claim 13 wherein one or more non-coincident openings are made in said diaphragm and said cover member.

21. The acoustic transducer of claim 13 wherein said perimeter is corrugated.

22. The acoustic transducer of claim 13 wherein said cover member includes a support structure and said diaphragm is held in position against said support structure by electrostatic attraction forces generated between said diaphragm and said perforated member due to said electrical field.

23. The acoustic transducer of claim 13 wherein said diaphragm and cover member are made on a silicon wafer using photo lithographic techniques.

24. The acoustic transducer of claim 13 wherein said diaphragm and cover member are made from one or more materials consisting of carbon-based polymers, silicon, polycrystalline silicon, amorphous silicon, silicon dioxide, silicon nitride, silicon carbide, germanium, gallium arsenide, carbon, titanium, gold, iron, copper, chromium, tungsten, aluminum, platinum, palladium, nickel, tantalum and their alloys.

25. An acoustic transducer comprising:
   a cover member having a planar surface with a plurality of perforations therein;
   a substrate operably attached to the perforated member;
   a diaphragm positioned between the cover member and the substrate, the diaphragm laterally movable within a plane parallel to the planar surface of the cover member, wherein the cover member includes a perimeter of attachment between the cover member and the substrate that is shaped to reduce the sensitivity of the cover member to intrinsic internal bending moments.

26. The acoustic transducer of claim 25 wherein the perimeter is corrugated.

27. The acoustic transducer of claim 25 wherein the cover member and the substrate define a lateral restraint.

28. The acoustic transducer of claim 25 wherein the diaphragm includes an indentation to prevent stiction between the diaphragm and the substrate.

29. The acoustic transducer of claim 25 wherein the cover member includes a support structure having an opening to reduce sensitivity of the cover member to intrinsic internal bending moments.

30. The acoustic transducer of claim 25 including a mechanical spring operably connected to the cover member and the diaphragm.

31. The acoustic transducer of claim 25 wherein the diaphragm and the cover member include coincident openings to provide a low frequency pressure equalization path across the diaphragm.

32. The acoustic transducer of claim 31 including a plurality of the coincident openings.

33. The acoustic transducer of claim 25 wherein the cover member includes a support structure having an openings to provide a low frequency pressure equalization path across the diaphragm.

34. The acoustic transducer of claim 25 wherein the cover member includes a support structure for supporting the diaphragm when the transducer is biased.

35. An acoustic transducer comprising:

a substrate;

a cover member having a planar surface and a support structure;

a diaphragm positioned between the cover member and the substrate, the diaphragm laterally movable within a plane parallel to the planar surface of the cover member, wherein the support structure engages the periphery of the diaphragm when the transducer is biased, to maintain the spacing of the diaphragm from the cover member.

36. The transducer of claim 35 wherein the cover member includes a plurality of perforations.

37. The transducer of claim 35 wherein the support structure is continuous.

38. The transducer of claim 35 wherein the support structure comprises a plurality of bumps.

39. An acoustic transducer comprising:

a substrate;

a cover member having a planar surface and a support structure;

a diaphragm;

means for suspending the diaphragm from the substrate to permit free movement of the diaphragm within its plane, wherein the support structure engages the periphery of the diaphragm when the transducer is biased, to maintain the spacing of the diaphragm from the cover member.

40. The transducer of claim 39, wherein the suspending means comprises high compliance springs.

41. The transducer of claim 39, wherein the support structure is continuous.

42. The transducer of claim 39, wherein the support structure comprises a plurality of bumps.

* * * * *

UNITED STATES PATENT AND TRADEMARK OFFICE
CERTIFICATE OF CORRECTION

PATENT NO. : 6,535,460 B2
DATED : March 18, 2003
INVENTOR(S) : Loeppert et al.

It is certified that error appears in the above-identified patent and that said Letters Patent is hereby corrected as shown below:

<u>Title page,</u>
Item [75], Inventor, "Pederson" should read -- Pedersen --.

Signed and Sealed this

Fifteenth Day of July, 2003

JAMES E. ROGAN
*Director of the United States Patent and Trademark Office*